United States Patent
Sasaki et al.

(10) Patent No.: US 7,042,142 B2
(45) Date of Patent: May 9, 2006

(54) MULTILAYER PIEZOELECTRIC ELEMENT

(75) Inventors: Satoshi Sasaki, Yuri-gun (JP); Shinya Syoji, Yuri-gun (JP); Kazushi Tachimoto, Yuri-gun (JP)

(73) Assignee: TDK Corporation, Tokyo (JP)

( * ) Notice: Subject to any disclaimer, the term of this patent is extended or adjusted under 35 U.S.C. 154(b) by 8 days.

(21) Appl. No.: 10/788,395

(22) Filed: Mar. 1, 2004

(65) Prior Publication Data

US 2004/0174094 A1    Sep. 9, 2004

(30) Foreign Application Priority Data

Mar. 3, 2003  (JP)  .............................. 2003-056092

(51) Int. Cl.
    *H01L 41/83*    (2006.01)
(52) U.S. Cl. ...................... 310/365; 310/364; 310/366
(58) Field of Classification Search ........ 310/364–366, 310/328
    See application file for complete search history.

(56) References Cited

U.S. PATENT DOCUMENTS

2005/0140251 A1*  6/2005  Sasaki ........................ 310/366

FOREIGN PATENT DOCUMENTS

| JP | 08051239 A | * | 2/1996 |
| JP | A 2002-036544 | | 2/2002 |
| JP | A 2002-254634 | | 9/2002 |
| JP | A 2002-254657 | | 9/2002 |
| JP | 2004241669 A | * | 8/2004 |
| JP | 2004259865 A | * | 9/2004 |
| JP | 2004260110 A | * | 9/2004 |
| JP | 2004266154 A | * | 9/2004 |
| JP | 2004268325 A | * | 9/2004 |
| JP | 2004288987 A | * | 10/2004 |
| JP | 2004296525 A | * | 10/2004 |
| JP | 2004296527 A | * | 10/2004 |

* cited by examiner

*Primary Examiner*—Darren Schuberg
*Assistant Examiner*—J. Aguirrechea
(74) *Attorney, Agent, or Firm*—Oliff & Berridge, PLC

(57) ABSTRACT

A multilayer piezoelectric element has at least one first piezoelectric layer and at least one second piezoelectric layer. First internal electrodes are separately arranged on each first layer, and second internal electrodes are arranged on each second layer. The first and second layers are laminated alternately so that the first and second internal electrodes overlap in one-to-one correspondence.

15 Claims, 14 Drawing Sheets

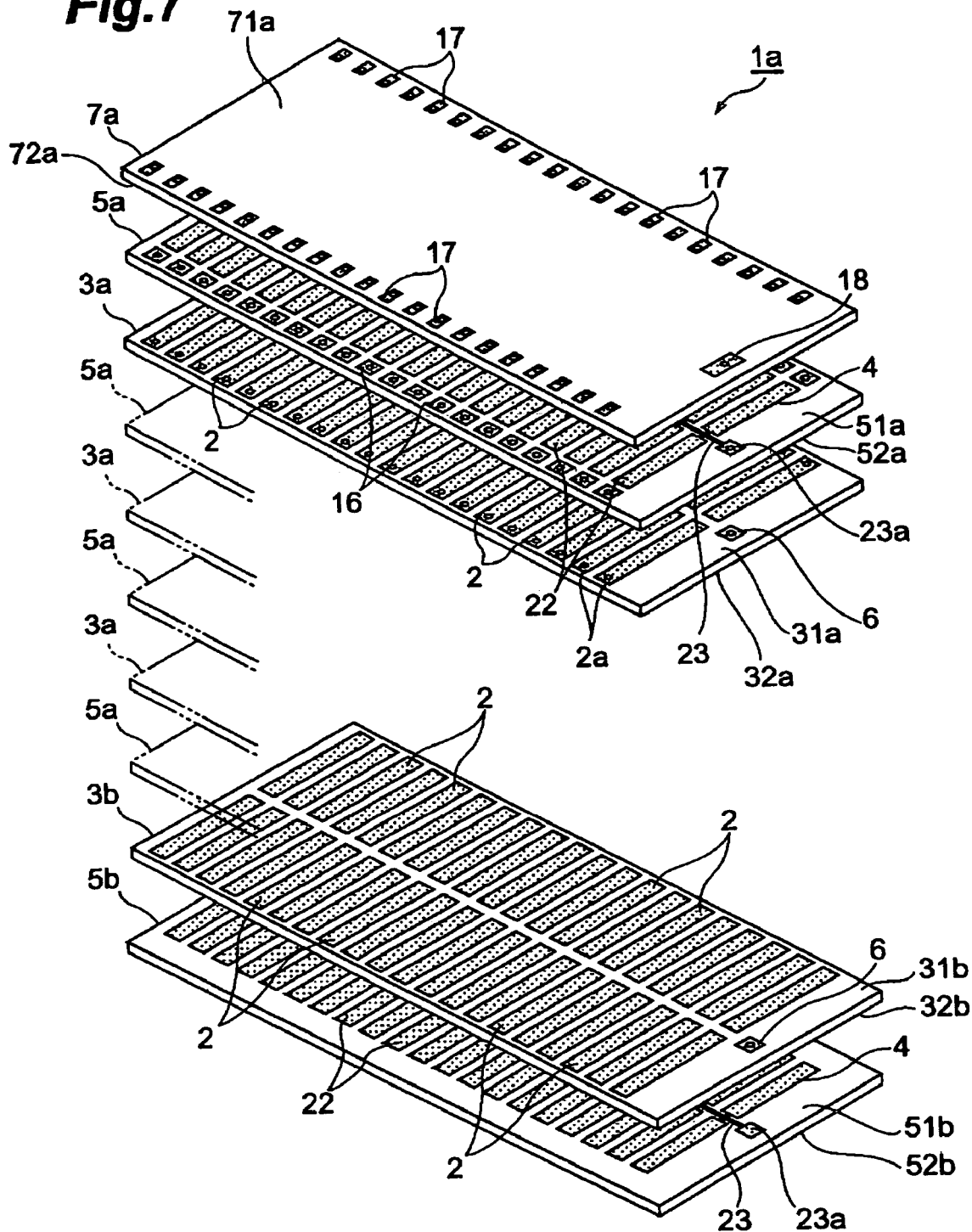

MULTILAYER PIEZOELECTRIC ELEMENT

BACKGROUND OF THE INVENTION

1. Field of the Invention

The present invention relates to a multilayer piezoelectric element used as a driver to cause minute displacements necessary for valve control of micropumps and the like.

2. Related Background Art

A multilayer piezoelectric element is disclosed in Japanese Patent Application Laid-Open No. 2002-254634. The multilayer piezoelectric element has the piezoelectric layers each patterned with a number of individual electrodes and the piezoelectric layers each patterned with a common electrode are alternately laminated. The individual electrodes aligned in the thickness direction of the multilayer piezoelectric element are connected to each other by electric conductor by way of through holes formed in the piezoelectric layers. When a voltage is applied between a predetermined individual electrode and common electrode, the multilayer piezoelectric element displaces the active portion (the portion where distortion is generated by a piezoelectric effect) corresponding to the predetermined individual electrode in the piezoelectric layers.

SUMMARY OF THE INVENTION

In the above multilayer piezoelectric element, when a voltage is applied between a predetermined individual electrode and common electrode, an electric field occurs not only between the individual electrode and the portion of the piezoelectric layer opposing the predetermined individual electrodes but also between the individual electrode and the surroundings of the opposing portion. It is because the common electrode is shaped in a continuous sheet so as to oppose a number of individual electrodes. Since electric fields occur also in directions different from the thickness direction of the piezoelectric layer as such, errors may occur in the displacement of the active portion corresponding to the individual electrode.

In view of such circumstances, it is an object of the present invention to provide a multilayer piezoelectric element which can accurately displace active portions in piezoelectric layers.

In one aspect, the present invention relates to a multilayer piezoelectric element comprising at least one first piezoelectric layer and at least one second piezoelectric layer. The first piezoelectric layer has an upper surface on which a plurality of first internal electrodes are separately arranged. The second piezoelectric layer has an upper surface on which a plurality of second internal electrodes are arranged. The first and second piezoelectric layers are laminated alternately so that the first and second internal electrodes overlap in one-to-one-correspondence.

The first internal electrodes may be disposed in a matrix on each first piezoelectric layer.

The second internal electrodes may be electrically connected to each other on each second piezoelectric layer.

Each second piezoelectric layer may include an extraction electrode electrically connected to the second internal electrodes on the upper surface thereof. The multilayer piezoelectric element may comprise an external electrode electrically connecting the extraction electrodes on the second piezoelectric layers to each other.

The second internal electrodes may be separately arranged on the upper surface of each second piezoelectric layer.

The multilayer piezoelectric element may comprise a third piezoelectric layer having an upper surface on which a plurality of first terminal electrodes and a second terminal electrode are provided. The first terminal electrodes may be electrically connected to the first internal electrodes on each first piezoelectric layer in one-to-one correspondence. The second terminal electrode may be electrically connected to the second internal electrodes on each second piezoelectric layer.

The multilayer piezoelectric element may comprise a plurality of external electrodes each of which electrically connects one of the first terminal electrodes on the third piezoelectric layer to the corresponding one of the first internal electrodes on each first piezoelectric layer.

The multilayer piezoelectric element may comprise an external electrode connecting the second terminal electrode on the third piezoelectric layer to the second internal electrode on each second piezoelectric layer.

The third piezoelectric layer may have a plurality of through holes extending from the respective first terminal electrodes. The electrical conductors may be disposed in the through holes so as, to electrically connect the first terminal electrodes to the respective first internal electrodes.

One of the second piezoelectric layers may be interposed between the third piezoelectric layer and one of the first piezoelectric layers. The interposed second layer may have a plurality of through holes in which electrical conductors are disposed so as to electrically connect the electrical conductors in the through holes of the third piezoelectric layer to the respective first internal-electrodes.

The third piezoelectric layer may have a through hole extending from the second terminal electrode. An electrical conductor may be disposed in the through hole so as to electrically connect the second terminal electrode to the second internal electrode.

One of the first piezoelectric layers may be interposed between the two second piezoelectric layers. The interposed first layer may have a through hole in which an electrical conductor is disposed so as to electrically connect the electrical conductors in the through holes of the two second piezoelectric layers to each other.

The upper surfaces of the first and second piezoelectric layers may be substantially parallel to each other. One of the first and second internal electrodes overlapping with each other may extend longer than that of the other does in a direction parallel to the upper surfaces.

The multilayer piezoelectric element may comprise an additional piezoelectric layer having an upper surface on which a third internal electrode is provided. The third internal electrode may be shaped in a continuous sheet having a perimeter extending along the circumference of the upper surface of the additional piezoelectric layer with a gap therebetween. The third internal electrode may be filled with electrically conducting material inside the perimeter. The additional piezoelectric layer may be disposed under one of the first and second piezoelectric layer located at the lowest position or over one of the first and second piezoelectric layer located at the highest position.

The third internal electrode may include an extraction portion. The second internal electrodes may be electrically connected to each other on each second piezoelectric layer. Each second piezoelectric layer may include an extraction electrode electrically connected to the second internal electrodes on the upper surface thereof. The multilayer piezoelectric element may comprise an external electrode electrically connecting an extraction electrode on each second piezoelectric layer to the extraction portion of the third internal electrode. The additional piezoelectric layer may be disposed so that the first piezoelectric layer is interposed between the additional piezoelectric layer and the second piezoelectric layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7 is an exploded perspective view showing the second embodiment of the multilayer piezoelectric element in accordance with the present invention.

DESCRIPTION OF THE PREFERRED EMBODIMENTS

Figure 1:
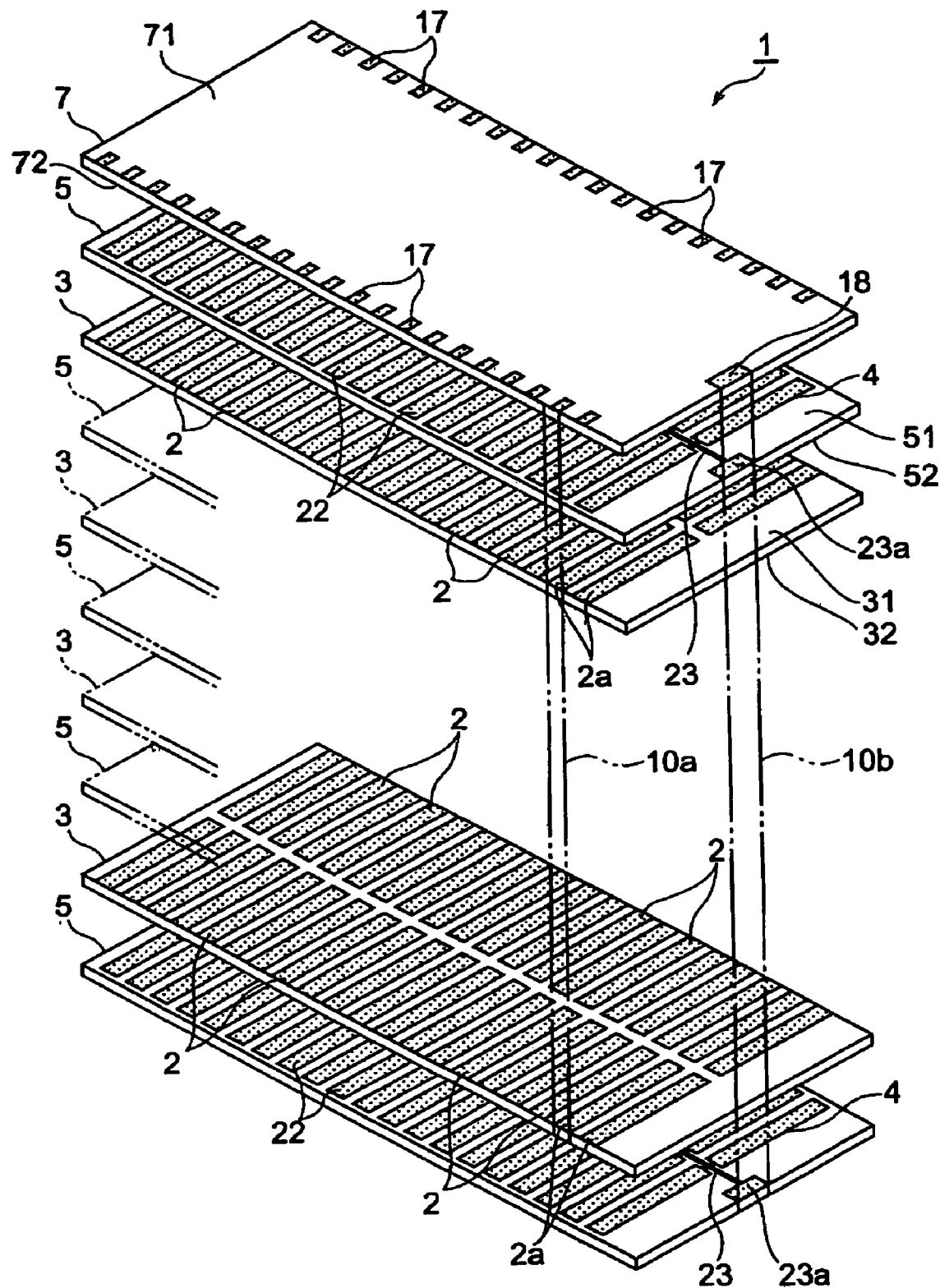
FIG. 1 is an exploded perspective view showing the first embodiment of the multilayer piezoelectric element in accordance with the present invention.

The preferred embodiments of the present invention will be described below in greater detail with reference to the accompanying drawings. To facilitate understanding, identical reference numerals are used, where possible, to designate identical or equivalent elements that are common to the embodiments, and, in subsequent embodiments, these elements will not be further explained.

First Embodiment

As shown in FIG. 1, the multilayer piezoelectric element 1 of the first embodiment is configured so that piezoelectric layers 3 and 5 are alternately laminated in a vertical direction and a piezoelectric layer 7 is laminated on top of the laminated layers 3 and 5 as the uppermost layer of the element 1. The piezoelectric layers 3, 5 and 7 have upper and lower surfaces 31 and 32, 51 and 52, and 71 and 72, respectively. Each of the piezoelectric layers 3 has individual electrodes (first inner electrodes) 2 on its upper surface 31. Each of the piezoelectric layers 5 has a common electrode 4 on its upper surface 51. The piezoelectric layer 7 has external electrodes (terminal electrodes) 17 and 18 on its upper surface 71.

Each of the piezoelectric layers 3, 5 and 7 is mainly composed of ceramics such as lead zirconate titanate. The layers 3, 5 and 7 have the same shape, that is, each of these layers is a thin and rectangular flat plate with a constant thickness, the dimension of which is 10 mm×30 mm with a thickness of 30 μm, for example. Each layer has rectangular principal surfaces, that is, upper and lower surfaces. The upper and lower surfaces of the layers 3, 5 and 7 are substantially parallel to each other. The individual electrodes 2 and the common electrode 4 are mainly composed of silver and palladium, and patterned by screen printing.

Figure 2:
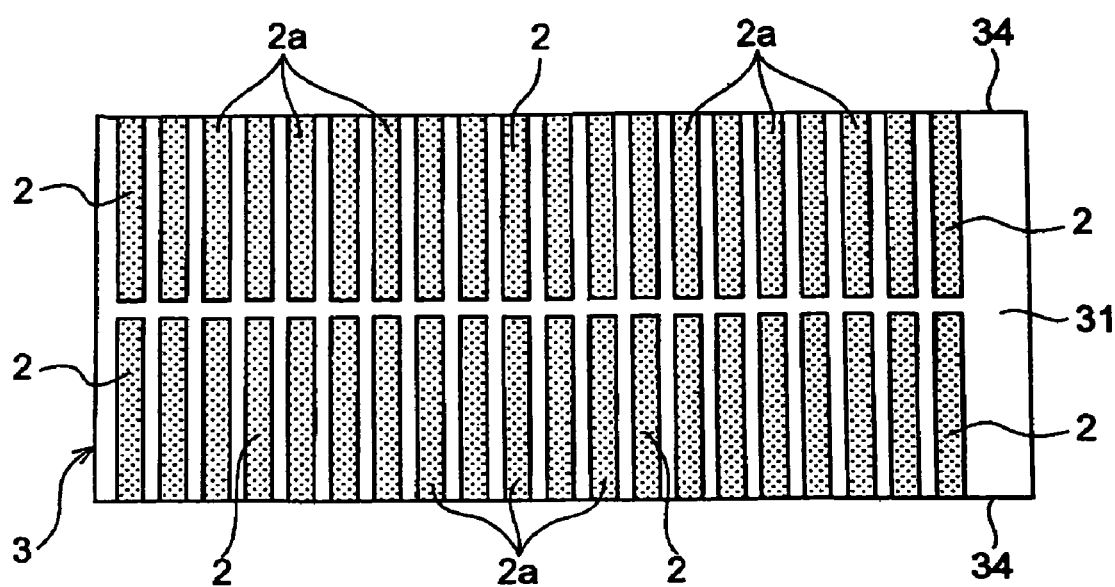
FIG. 2 is a plan view of the third, fifth, seventh, and ninth piezoelectric layers in the multilayer piezoelectric element shown in FIG. 1.

In the multilayer piezoelectric element 1, the piezoelectric layers 3 are the third, fifth, seventh and ninth layers from the top of the element 1. A number of individual electrodes 2 are disposed in a matrix on the upper surface of each layer 3, as shown in FIG. 2. The individual electrodes 2 are arranged separately with a predetermined gap so as to be electrically insulated from each other and kept from affecting each other when vibrating. Assuming that, in the matrix of the individual electrodes 2, the rows extend in the longitudinal direction of the piezoelectric layer 3 and the columns extend in the lateral direction perpendicular to the longitudinal direction, the individual electrodes 2 are arranged in a matrix of 2 rows by 75 columns (only 2 rows by 20 columns being depicted t simplify the drawing), for example.

Such a matrix enables a number of individual electrodes 2 to be efficiently disposed on the piezoelectric layer 3. Accordingly, the multilayer piezoelectric element 1 can be small or the individual electrodes 2 can be highly integrated while obtaining the sufficient area of active portions contributing to the vibration in the piezoelectric layer 3.

Each of the individual electrodes 2 is formed in an elongated rectangle and arranged so that its longitudinal direction is orthogonal to the longitudinal direction of the piezoelectric layer 3. A longitudinal outer end 2a of each individual electrode 2 reaches either of the two longitudinal edges 34 of the upper surface 31. The outer end 2a is exposed to the outside of the piezoelectric element 1 while being sandwiched between the piezoelectric layers 3 and 5.

As shown in FIG. 1, the outer ends 2a of the individual electrodes 2 on the different layers 3 are aligned vertically, that is, aligned in the thickness direction of the multilayer piezoelectric element 1, and the aligned ends 2a are electrically connected to each other by external electrodes 10a mainly composed of silver. In the following, "thickness direction of the multilayer piezoelectric element 1", i.e., "thickness direction of the piezoelectric layer 3 or 5", will simply be referred to as "thickness direction."

FIG. 1 shows only a line of external electrode 10a by dash-double-dot lines for simplicity of the drawing. However, in practice, there are a plurality of external electrodes 10a extending substantially parallel to each other and all the outer ends 2a aligned in the thickness direction are electrically connected to each other by the respective external electrodes 10a.

Figure 3:
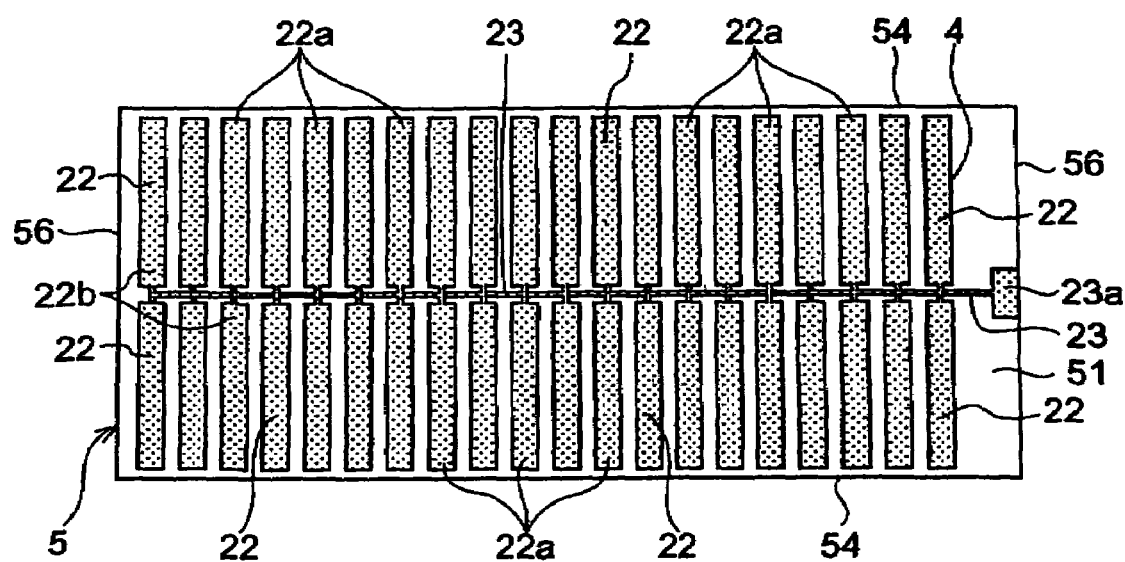
FIG. 3 is a plan view of the second, fourth, sixth, eighth, and tenth piezoelectric layers in the multilayer piezoelectric element shown in FIG. 1.

The piezoelectric layers 5 are the second, fourth, sixth, eighth, and tenth layers from the top of the piezoelectric element 1. The common electrode 4 is provided on the upper surface 51 of each layer 5. As shown in FIG. 3, each common electrode 4 has a plurality of electrode portions (second internal electrodes) 22. The number of the electrode portions 22 is same as that of the individual electrodes 2. The, electrode portions 22 oppose their corresponding electrodes 2 on the piezoelectric layers 3 in the thickness direction. The electrode portions 22 are arranged on the upper surface 51 so as to overlap with the respective individual electrodes 2. That is, the electrode portions 22 and the individual electrodes 2 are alternately aligned in the thickness direction so that they are overlapped with each other. Each common electrode 4 also has a narrow extraction portion 23. The extraction portion 23 extends in the longitudinal direction of the piezoelectric layer 5 between the first and second rows of the electrode portions 22.

Each electrode portion 22 is shaped in an elongated rectangle, and disposed so that, its longitudinal direction is orthogonal to the longitudinal direction of the piezoelectric layer 5. A longitudinal outer end 22a of each electrode portion 22 is placed apart from either of the two longitudinal edges 53 of the layer 5 with a predetermined gap so as to be electrically insulated from the outside of the multilayer piezoelectric element 1. A longitudinal inner end 22b of each electrode portion 22 is connected to the extraction portion 23.

An end 23a of the extraction portion 23 is placed at one of the lateral edges 56 of the piezoelectric layer 5 and exposed to the outside of the element 1 while being sandwiched between the piezoelectric layers 3 and 5 or between the piezoelectric layers 5 and 7. As shown in FIG. 1, the ends 23a of the extraction portions 23 on the different layers 5 are aligned in the thickness direction and electrically connected to each other by an external electrode 10b mainly composed of silver.

Since the electrode portions 22 are electrically connected to each other by way of the extraction portion 23 so as to form the common electrode 4, the structure of the multilayer piezoelectric element 1 can be simplified, for example, by providing common wiring between the electrode portions 22 and the outside of the element 1. When compared to the piezoelectric element with the common electrode solidly formed in a continuous sheet, the amount of silver and palladium mainly constituting the common electrode 4 can be suppressed, whereby the multilayer piezoelectric element 1 can be made at a lower cost.

Figure 4:
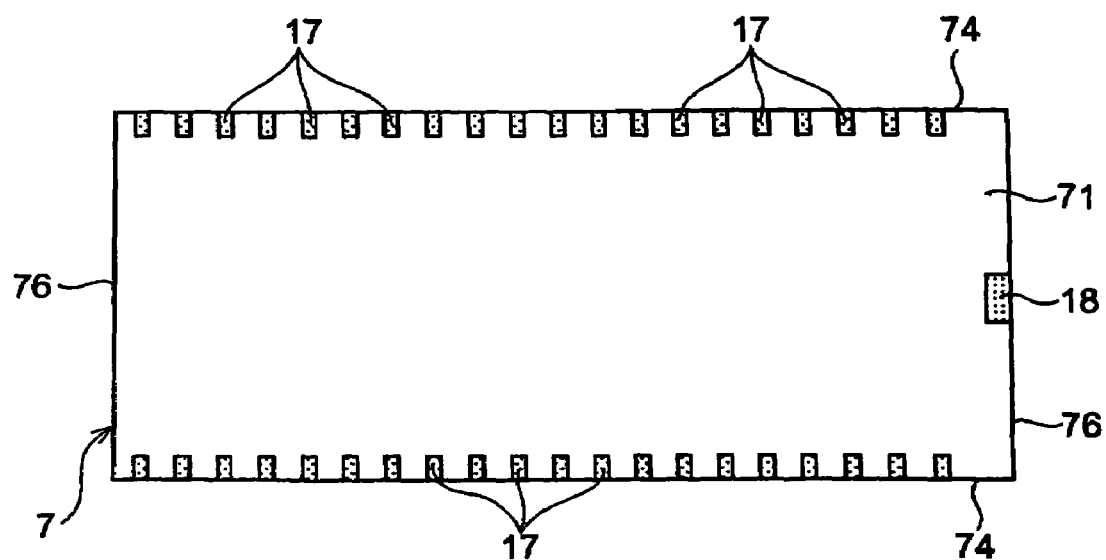
FIG. 4 is a plan view of the, uppermost piezoelectric layer in the multilayer piezoelectric element shown in FIG. 1.

As shown in FIG. 4, a plurality of external electrodes 17 and an external electrode 18 are provided on the upper surface 71 of the uppermost piezoelectric layer 7. The external electrodes 17 are arranged so as to adjoin the longitudinal edges 74 of the upper surface 71. The external electrode 18 adjoins one of the lateral edges 76 of the upper surface 71. As shown in FIG. 1, each external electrode 17 is connected to the corresponding external electrode 10a, which extends along one of the side surfaces of the layer 7, to form an integral body. Similarly, the external electrode 18 is connected to the external electrode 10b extending along another side face of the layer 7 to form an integral body. The external electrodes 17 and 18 are to be attached to leads for electrically connecting the multilayer piezoelectric element 1 to a driving power supply, and therefore serve as, terminal electrodes of the element 1.

Figure 5:
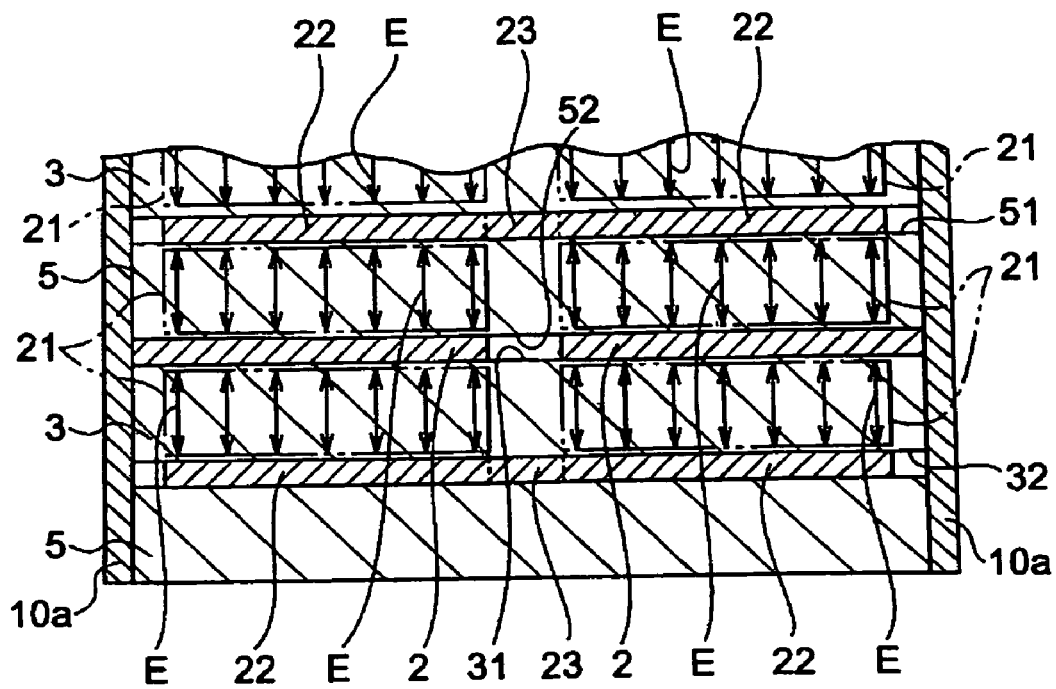
FIG. 5 is an enlarged sectional view taken along the direction perpendicular to the longitudinal direction of the multilayer piezoelectric element shown in FIG. 1.

When the piezoelectric layers 3, 5 and 7 are laminated together in the order shown in FIG. 1, the individual electrodes 2 are located at the upper surface side of the layer 3, and the electrode portions 22 of the common electrode 4 are located at the lower surface side of the layer 3, as shown in FIG. 5. Also, the individual electrodes 2 are located at the lower surface side of the layer 5, and the electrode portions 22 of the common electrode 4 are located at the upper surface side of the layer 5. The individual electrodes 2 and the electrodes portions 22 overlap in one-to-one correspondence.

As shown in FIG. 1, five electrode portions 22 and four individual electrodes 2 are alternately aligned in the thickness direction for each external electrode 17 on the uppermost layer 7. Therefore, when a voltage is applied between one of the external electrodes 17 and the external electrode 18, the corresponding voltage is caused between the individual electrode 2 and the electrode portion 22 aligned under the external electrode 17 by way of the external electrodes 10a and 10b. As a consequence, an electric field E occurs in a portion of the piezoelectric layer held between the individual electrode 2 and electrode portion 22, as shown in FIG. 5, to cause displacement in this portion as an active portion 21 of the piezoelectric element 1.

Therefore, when one of the external electrodes 17 is chosen for voltage application, the active portions 21 located under the chosen external electrode 17 among the active portions 21 corresponding to the individual electrodes 2 arranged in a matrix can be displaced in the thickness direction. Hence, the multilayer piezoelectric element 1 can be used as a driver for various devices requiring minute displacement, in valve control of micropumps, for example.

In the multilayer piezoelectric element 1, as in the foregoing, the part held between the individual electrode 2 and electrode portion 22 opposing each other in the thickness direction becomes an active portion 21, and the electric field E occurs across the active portion 21 between the individual electrode 2 and electrode portion 22 when a voltage is applied therebetween, whereby the active portion 21 is displaced. The electrode portion 22 opposes its corresponding individual electrode 2 in the thickness direction, so that the electric field E is restrained from occurring in directions different from the thickness direction, as shown in FIG. 5. In other words, the piezoelectric layer 5 has electrically insulating portions arranged in the longitudinal direction of the layer 5 (that is, the portions placed between adjacent electrode portions 22), which prevents the electric field E from occurring in directions different from the thickness direction. Consequently, the multilayer piezoelectric element 1 can accurately displace the active portions 21 in the piezoelectric layers 3 and 5.

Figure 6:
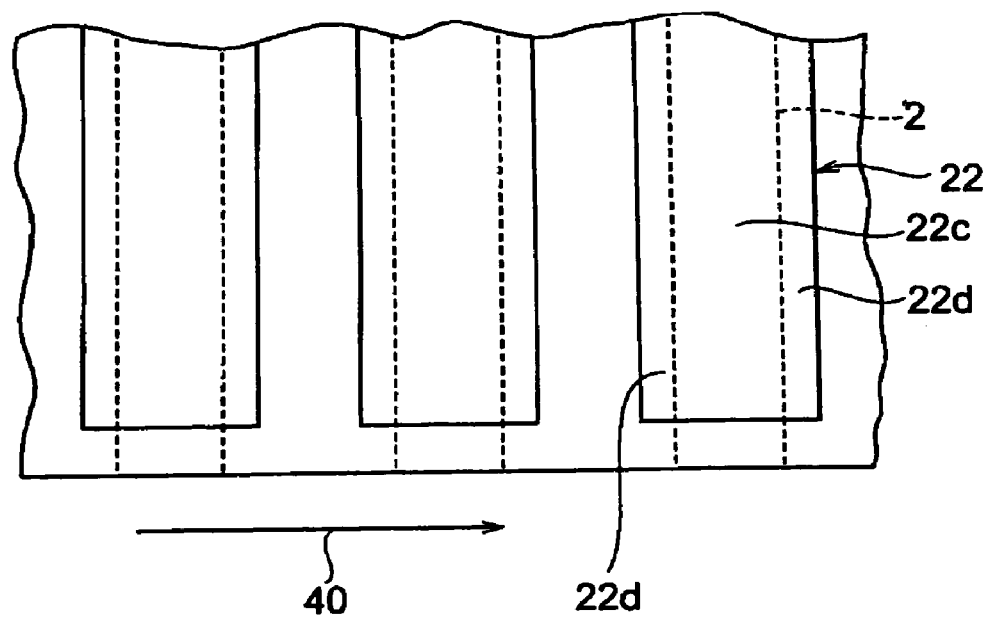
FIG. 6 is a plan view showing an example of an arrangement of internal electrodes in the multilayer piezoelectric element.

Regarding the opposing electrode portion 22 and individual electrode 2, the electrode portion 22 may have a length greater than that of the individual electrode 2 in the longitudinal direction 40 of the piezoelectric layers 3 and 5, as shown in FIG. 6. Due to the difference in the length in the direction 40, the electrode portion 22 includes not only the rectangular portion 22c directly opposing the individual electrode 2 but also the extensions 22d which extends from the opposing sides of the covering portion 22c. The difference in the length accommodates the positional deviation between the electrode portion 22 and the individual electrode 2 in the longitudinal direction 40. Accordingly, the alignment between the opposing individual electrode 2 and electrode portion 22 can be easier. Preferably, the increase of width of the electrode portion 22 is 10% or less of the width of the individual electrode 2. This is because the effect of restraining the electric fields from occurring in directions different from the thickness direction lowers when the increase exceeds 10%.

Such an effect can be obtained when the length of the individual electrode 2 is greater than that of the electrode portion 22 in the longitudinal direction 40 of the piezoelectric layers 3 and 5. More generally, when one of the individual electrode 2 and electrode portion 22 has a shape to embrace the other in a predetermined direction along the upper surfaces of the piezoelectric layers 3 and 5, the above effect is obtained for the positional deviation in the predetermined direction, which is not limited to the longitudinal direction 40 of the layers 3 and 5. In other words, when one of the opposing individual electrode 2 and electrode portion 22 extends longer than that of the other does in a direction, it is possible to acquire the effect of accommodating the offset between the individual electrode 2 and electrode portion 22 in the extending direction.

A procedure of producing the multilayer piezoelectric element 1 will now be explained. First, a piezoelectric material mainly composed of ceramics such as lead zirconate titanate is mixed with an organic binder, an organic solvent, and the like, so as to yield a paste, and the paste is used to form material sheets as the piezoelectric layers 3, 5 and 7. Also, a metal material composed of silver and palladium at a predetermined ratio is mixed with an organic binder, an organic solvent, and the like, so as to yield electrically conductive paste for forming the electrode patterns.

Subsequently, the individual electrodes 2 and the common electrodes 4 are formed on the material sheets by screen printing using the conductive paste. The material sheets with the electrode patterns formed in this way are laminated in the above-mentioned order and pressed in the laminating direction to produce a green laminate. The green laminate is degreased and fired, and then silver is baked thereon to form the external electrodes 10a, 10b, 17 and 18. Further, a polarization process is carried out to finish the multilayer piezoelectric element 1. The external electrodes 10a, 10b, 17 and 18 may also be formed sputtering with gold.

The multilayer piezoelectric element 1 produced in this way can be prevented from waving and warping upon pressing and firing by additionally laminating a piezoelectric layer 25 on the lower surface 52 of the lowermost piezoelectric layer 5. The piezoelectric layer 25 has the same shape as the piezoelectric layers 3, 5 and 7. The piezoelectric layer 25 has the electrode pattern shown in FIG. 6A. The piezoelectric layer 25 has an upper surface 81 on which an overall electrode (third internal electrode) 26 is provided.

Figure 6A:
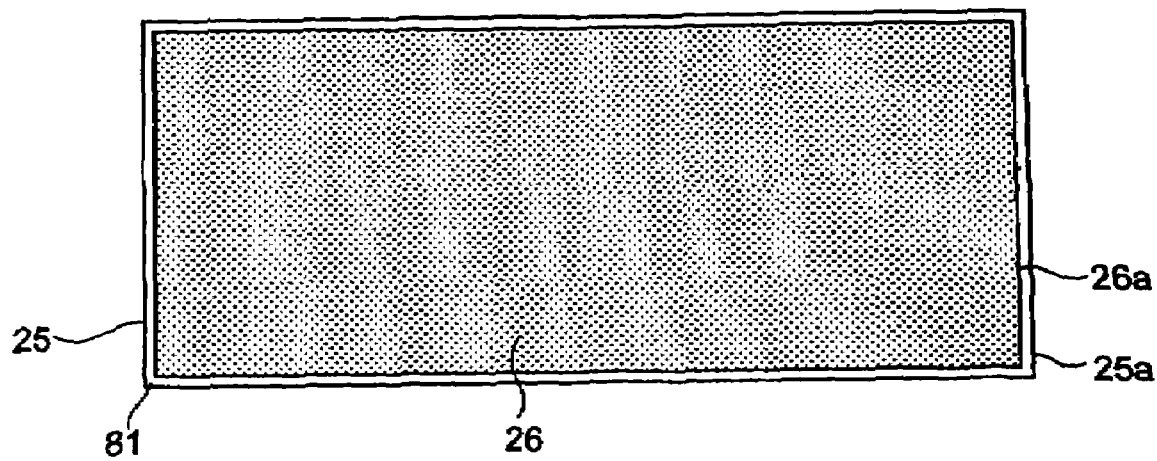
FIG. 6A is a plan view showing a piezoelectric layer with an overall electrode.

The layer 25 is disposed so that the upper surface 81 faces the lower surface 52 of the piezoelectric layer 5. The overall electrode 26 is formed as a continuous sheet with a rectangular perimeter 26a. The perimeter 26a extends along the circumference 25a of the upper surface 81 of the piezoelectric layer 25, as shown in FIG. 6A. The overall electrode is filled with electrically conducting material inside the perimeter 26a. A predetermined gap is provided between the perimeter 26a of the overall electrode 26 and the circumference 25a of the piezoelectric layer 25 so as to electrically insulate the overall electrode 26 from the outside of the multilayer piezoelectric element 1.

The piezoelectric layer 25 with such an electrode pattern may be interposed between the uppermost piezoelectric layer 7 and the adjacent piezoelectric layer 5 so that the upper surface 81 of the layer 25 faces the lower surface 72 of the layer 7. When the number of the laminated piezoelectric layers 3, 5 and 7 is large (e.g., 20), the waving and warping upon pressing and firing of the multilayer piezoelectric element 1 can be suppressed sufficiently by placing the piezoelectric layer 25 between the uppermost piezoelectric layer 7 and the adjacent piezoelectric layer 5 and also placing another piezoelectric layer 25 under the lowermost piezoelectric layer 5.

Figure 6B:
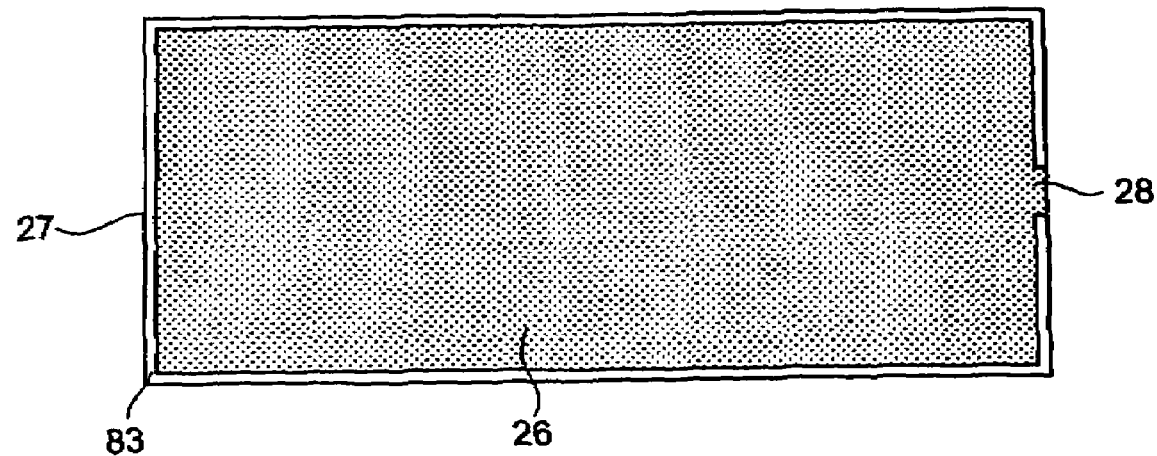
FIG. 6B is a plan view showing a piezoelectric layer having an overall electrode as a common electrode.

Alternatively, the waving and warping of the piezoelectric element 1 upon the pressing and firing can be suppressed by laminating a piezoelectric layer 27 with the following electrode pattern in place of one of the piezoelectric layers 5 which are the second, fourth, sixth, eighth, and tenth layers of the element 1, e.g., the sixth layer 5. As shown in FIG. 6B, the piezoelectric layer 27 has an upper surface 83 on which the above overall electrode 26 is provided. On the layer 27, the overall electrode 26 is integrally provided with an extraction portion 28 at a position to align with the ends 23a of the extraction portions 23 of the piezoelectric layers 5. The extraction portion 28 is electrically connected to the ends 23a of the extraction portions 23 of the piezoelectric layers 5 by way of the external electrode 10b, so that the overall electrode 26 serves as a common electrode for producing an electric field in the piezoelectric layers 3 and 5 in cooperation with the individual electrodes 2.

The piezoelectric layer 27 can be used in place of any one of the piezoelectric layers 5 interposed between other piezoelectric layers in the multilayer piezoelectric element 1 which includes the laminated piezoelectric layers 3, 5 and 7. Placing the piezoelectric layer 27 in the multilayer piezoelectric element 1 as an intermediate layer in addition to laminating the piezoelectric layers 25 at the above-mentioned two positions can more effectively prevent the element 1 from waving and warping when the number of laminated piezoelectric layers 3, 5, 7 is even larger.

By 10% or less of the number of the laminated piezoelectric layers in the multilayer piezoelectric element 1 (e.g., one or two layers when the number of the laminated piezoelectric layers is 20), the piezoelectric layers 25 and 27 with the foregoing electrode patterns can sufficiently prevent the element 1 from waving and warping. Preferably, the piezoelectric layers 25 and 27 are placed at such positions that the same number of piezoelectric layers. 3 and 5 are laminated between the layers 25 and 27.

Second Embodiment

As shown in FIG. 7, the multilayer piezoelectric element 1a of the second embodiment has the laminate pattern similar to that of the multilayer piezoelectric element 1 of the first embodiment; however, the element 1a differs from the element 1 in that the inner electrodes such as the individual electrodes 2 and common electrodes 4 are electrically connected to each other by way of through holes formed in the piezoelectric layers 3, 5 and the like. In the following, the multilayer piezoelectric element 1a of the second embodiment will be explained mainly in terms of the differences from the multilayer piezoelectric element 1 of the first embodiment.

Figure 8A:
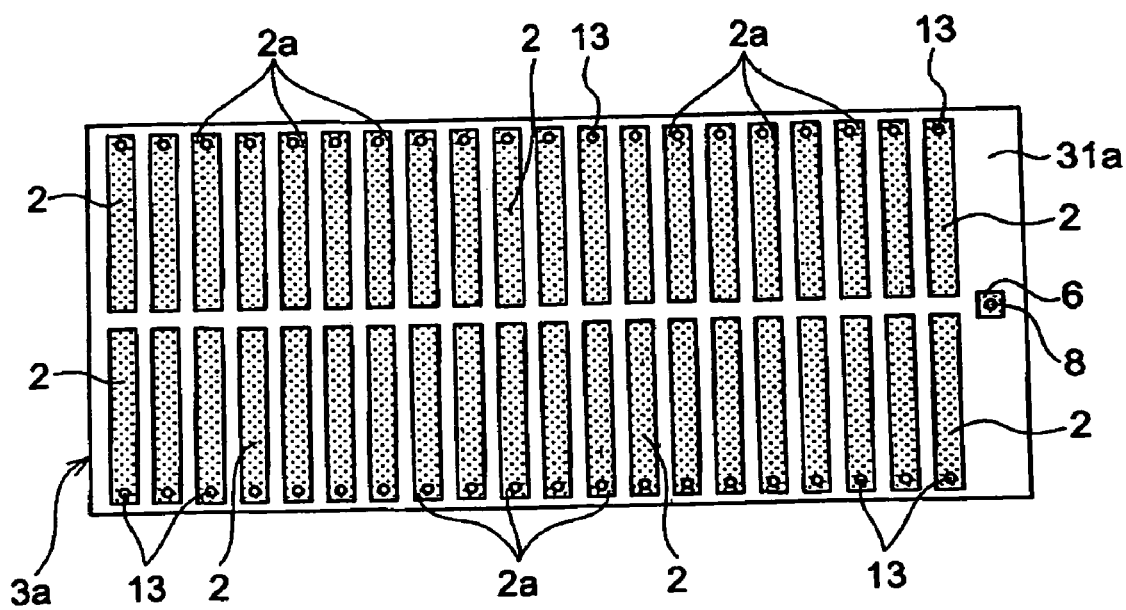
FIG. 8A is a plan view showing the piezoelectric layer as the third, fifth, and seventh layers of the piezoelectric element shown in FIG. 7.

As shown in FIG. 8A, a number of individual electrodes 2 are disposed in a matrix on the upper surface 31a of each of the piezoelectric layers 3a which are the third, fifth and seventh layers from the uppermost piezoelectric layer 7. The piezoelectric layers 3a has the same shape and composition as the piezoelectric layers 3 in the first embodiment. Each individual electrode 2 is formed in a rectangle and disposed so that its longitudinal direction is orthogonal to the longitudinal direction of the piezoelectric layer 3a. The outer end 2a of each individual electrode 2, which is used as a contact in this embodiment, is connected to an electric conductor in a through hole 13 formed in the piezoelectric layer 3a directly under the end 2a.

An intermediate electrode 6 is provided in the leading end of the upper surface 31a of the piezoelectric layer 3a. The intermediate electrode 6 is for electrically connecting the common electrodes 4 on the piezoelectric layers 5 over and under the piezoelectric layer 3a to each other. The intermediate electrode 6 is connected to the electric conductor in the through hole 13 formed in the piezoelectric 3a directly under the electrode 6.

Figure 8B:
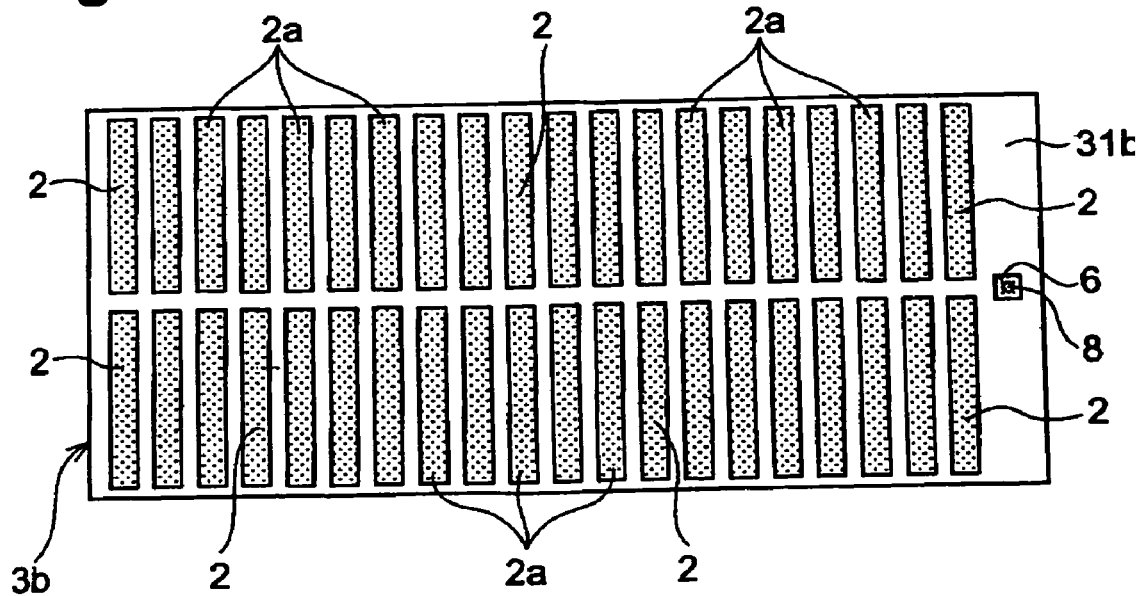
FIG. 8B is a plan view showing the piezoelectric layer as the ninth layer of the piezoelectric element.

The multilayer piezoelectric element 1a includes a piezoelectric layer 3b as its ninth layer. On the upper surface 31b of the piezoelectric layer 3b, the electrode pattern similar to that on each of the third, fifth, and seventh layers 3a is provided. However, as shown in FIG. 8B, the ninth layer 3b differs from the piezoelectric layers 3a in that no through holes 13 are formed.

Figure 9A:
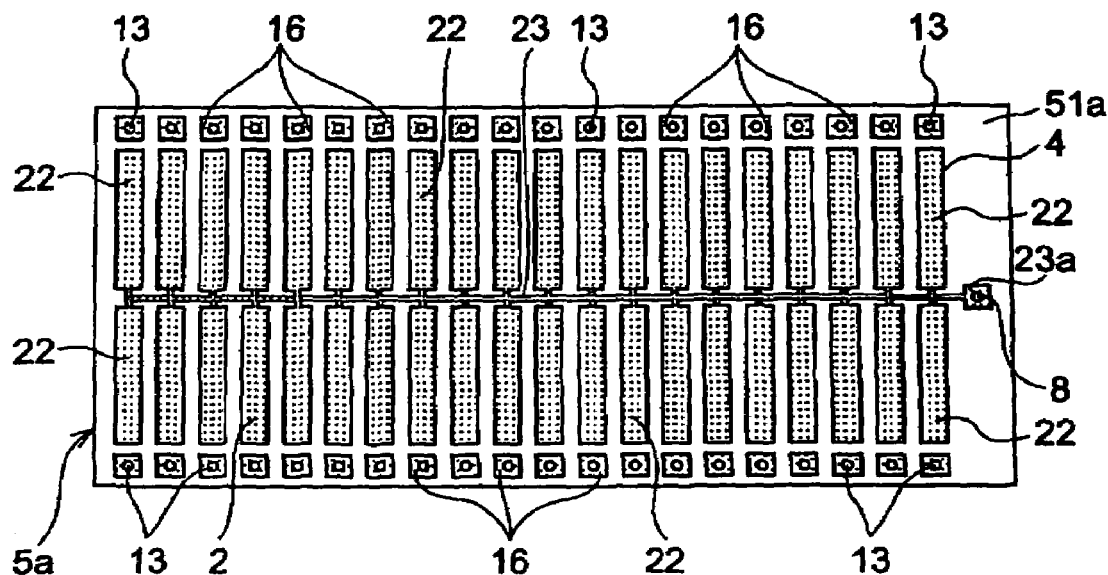
FIG. 9A is a plan view showing the piezoelectric layer as the second, fourth, sixth, and eighth layers of the piezoelectric element shown in FIG. 7.

The common electrode 4 is provided on the upper surface 51a of each of the piezoelectric layers 5a which are the second, fourth, sixth and eighth layers from the uppermost piezoelectric layer 7. The piezoelectric layers 5a has the same shape and composition as the piezoelectric layers 5 in the first embodiment. As shown in FIG. 9A, the common electrode 4 has the electrode portions 22 opposing their respective individual electrodes 2 on the piezoelectric layers 3 in the thickness direction, and a narrow extraction portion 23 extending in the longitudinal direction of the piezoelectric layer 3 between the first and second rows of the electrode portions 22.

Each electrode portion 22 has an elongated rectangular shape, and its longitudinal inner end is integrally connected to the extraction portion 23. The connection end 23a, which is one of the longitudinal ends of the extraction portion 23, opposes the intermediate electrode 6 of the piezoelectric layer 3a or 3b in the thickness direction and is connected to an electric conductor in a through hole 8 formed in the piezoelectric layer 5a directly under the connection end 23a.

A plurality of intermediate electrodes 16 are arranged on the upper surface 51a of the piezoelectric layer 5a. The intermediate electrodes 16 oppose their respective connection ends 2a on the piezoelectric layer 3a in the thickness direction. The intermediate electrodes 16 are connected to the respective conductors in the through holes 13 formed in the piezoelectric layer 5a directly under the electrodes 16.

Figure 9B:
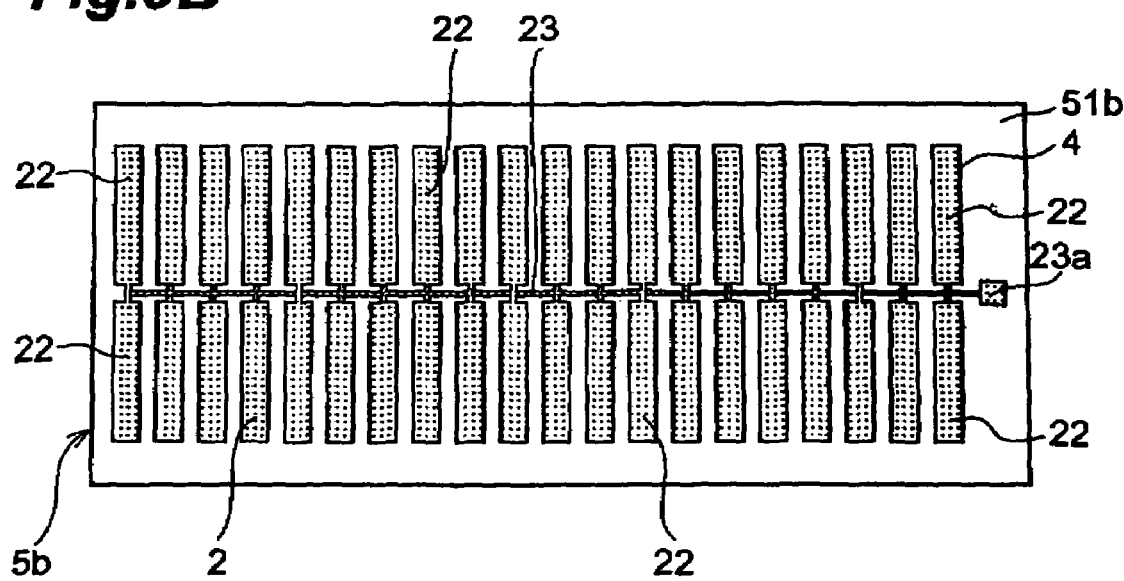
FIG. 9B is a plan view showing the piezoelectric layer as the tenth layer of the piezoelectric element.

The piezoelectric layer 5b, which is the tenth layer of the multilayer piezoelectric element 1a, has also the upper surface 51b having an electrode pattern similar to those of the piezoelectric layers 5a as the second, fourth, sixth and eighth layers. However, as shown in FIG. 9B, the tenth layer 5b differs from the above-mentioned layers 5a in that the intermediate electrodes 16 and the through holes 8 and 13 are not formed on the upper surface 51b.

Figure 10:
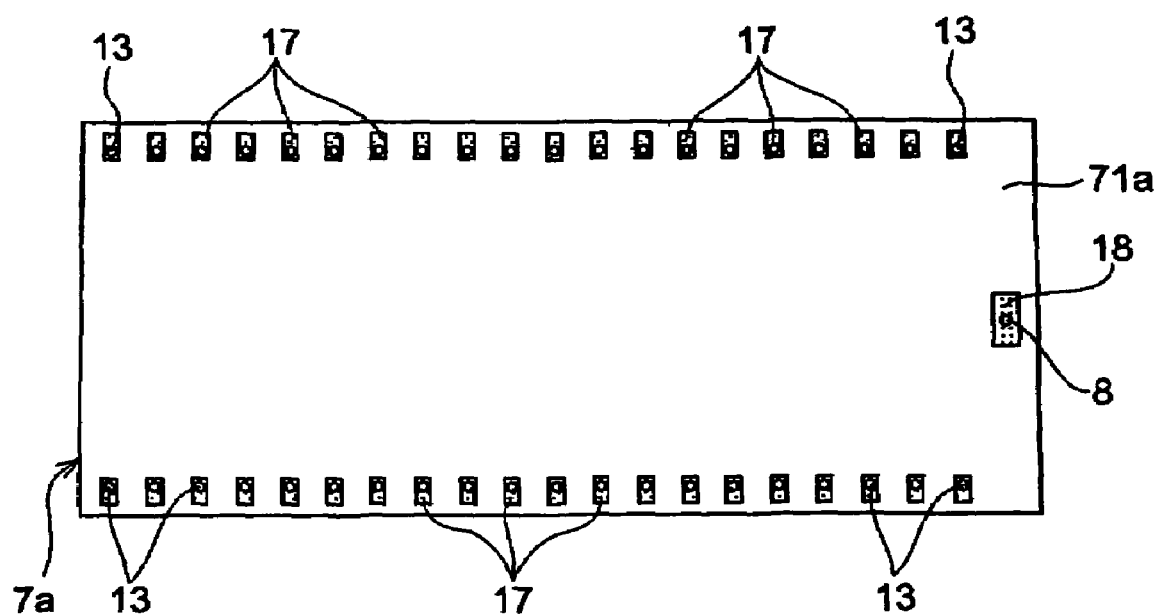
FIG. 10 is a plan view showing the uppermost piezoelectric layer in the multilayer piezoelectric element shown in FIG. 7.

The uppermost piezoelectric layer 7a has the same shape and composition as the piezoelectric layers 7 in the first embodiment. As shown in FIG. 10, on the upper surface 71a of the piezoelectric layer 7a, the external electrodes 17 are formed to oppose their corresponding intermediate electrodes 16 on the piezoelectric layers 5a in the thickness direction, and also the external electrode 18 are formed to oppose the intermediate electrodes 6 on the piezoelectric layers 3a in the thickness direction. The external electrodes 17 are connected to the respective conductors in the through holes 13 formed in the piezoelectric layer 7a directly under the electrodes 17, and the external electrode 18 is connected to the conductor in the through hole 8 formed in the piezoelectric layer 7a directly under the electrode 18. Each of the external electrodes 17 and 18 is provided with a silver baked electrode to which a lead is attached for electrical connection between the multilayer piezoelectric element 1a and a driving power supply, and serves as a terminal electrode of the element 1a.

When the piezoelectric layers 3a, 5a and 7a are laminated together in the order shown in FIG. 7, four of the individual electrodes 2 are aligned with each external electrode 17 on the uppermost layer 7a in the thickness direction by way of the intermediate electrodes 16, and the aligned electrodes 2, 16 and 17 are electrically connected to each other by the conductors in the through holes 13. The connection ends 23a of the five common electrodes 4 are aligned with the external electrode 18 on the uppermost layer 7a in the thickness direction by way of the internal electrodes 6, and the aligned electrodes 6, 18 and 23a are electrically connected to each other by the conductors in the through holes 8.

Such electrical connections in the multilayer piezoelectric element 1a allow a voltage applied between a predetermined external electrode 17 and the external electrode 18 to cause a voltage between the individual electrode 2 and the electrode portion 22 of the common electrode 4 aligned under the predetermined external electrode 17. As a consequence, in the piezoelectric layers 3a and 5a, an electric field occurs in the part held between the internal electrode 2 and the electrode portion 22 of the common electrode 4 to cause displacement in this portion as the active portion 21 of the element 1a. Hence, when one of the external electrode 17 is chosen for voltage application, the active portion 21 located under the chosen external electrode 17 among the active portions 21 corresponding to the individual electrodes 2 arranged in a matrix can be displaced in the thickness direction. Therefore, the multilayer piezoelectric element 1a can be used as a driver for various devices requiring minute displacement, in valve control of micropumps, for example.

In the multilayer piezoelectric element 1a of the second embodiment, as in the multilayer piezoelectric element 1 of the first embodiment, the electrode portions 22 of each common electrode 4 are formed so as to oppose their corresponding individual electrodes 2, so that electric fields are restrained from occurring in directions different from the thickness direction, which makes it possible to accurately displace the active portions 21 in the piezoelectric layers 3a and 5a.

A procedure of producing the multilayer piezoelectric element 1a of the second embodiment will now be explained. First, as in the multilayer piezoelectric element 1 of the first embodiment, material sheets to become the piezoelectric layers 3, 5 and 7 are formed. Also, electrically conductive paste for forming the electrode patterns is produced.

Subsequently, the material sheets to become the piezoelectric layers 3, 5 and 7 are irradiated with laser light at the predetermined positions to form the through holes 8 and 13. Thereafter, the through holes 8 and 13 are subjected to filling screen printing with the conductive paste to form the electric conductors in the through holes 8 and 13. Further, the material sheets are subjected to screen printing with the conductive paste to form the electrodes 2, 4, 17, 18 and the like.

The material sheets with the electrode patterns formed in this way are laminated in the above-mentioned order and pressed in the laminating direction to produce a green laminate. The green laminate is degreased, fired, and then polarized to finish the multilayer piezoelectric element 1a.

Third Embodiment

Figure 11:
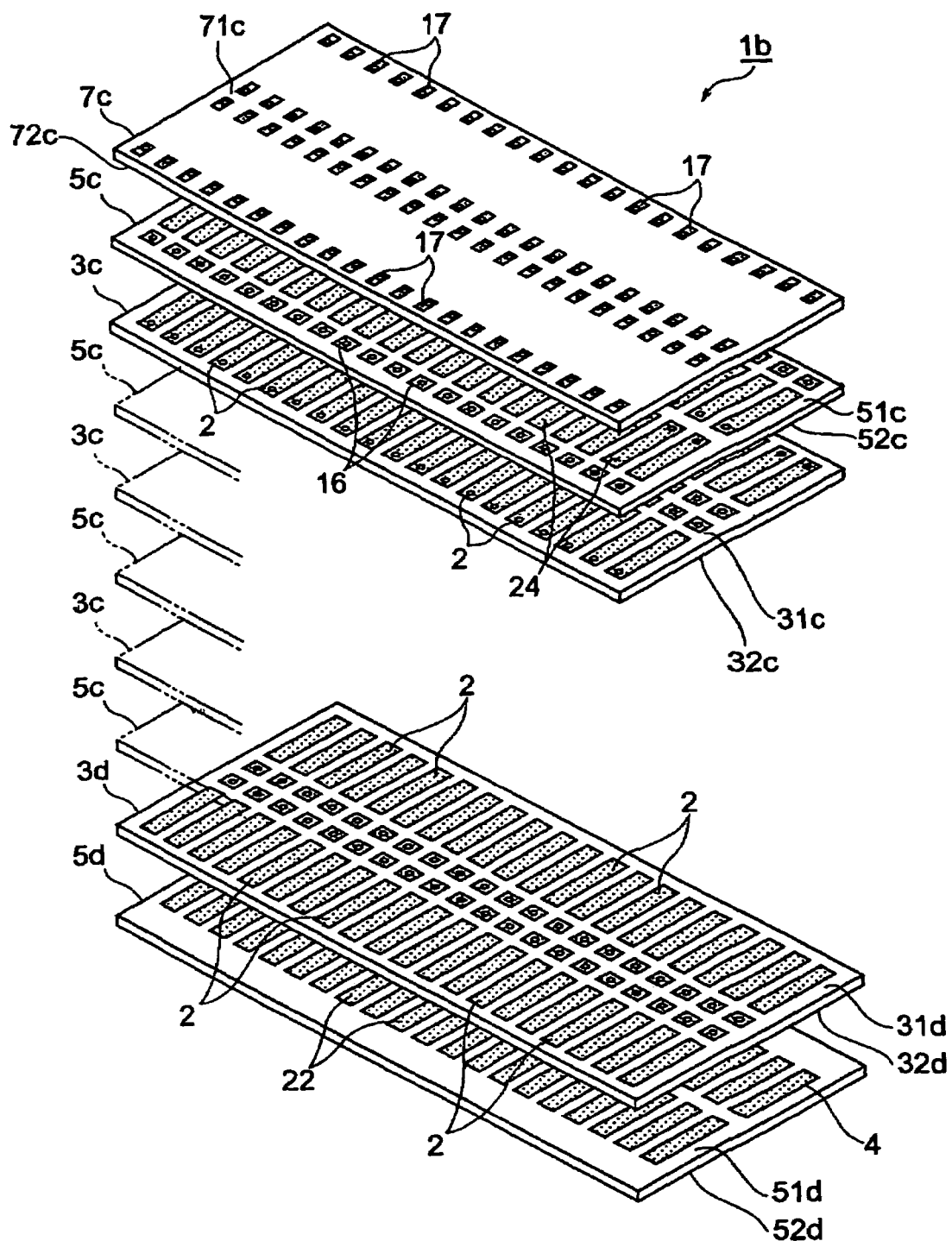
FIG. 11 is an exploded perspective view showing the third embodiment of the multilayer piezoelectric element in accordance with the present invention.

As shown in FIG. 11, the multilayer piezoelectric element 1b of the third embodiment has the laminate pattern similar to that of the multilayer piezoelectric element 1a of the second embodiment. The piezoelectric layers 3c, 3d, 5c, 5d, 7c and 7d in this embodiment have the same shape and composition as the layers 3a, 3b, 5a, 5b, 7a and 7b, respectively; however, they have the different electrode patterns on their upper surfaces. The piezoelectric element 1b is obtained by forming the electrode portions 22 of the common electrodes 4 in the second embodiment as individual electrodes 24 without forming the extraction portion 23.

Figure 12A:
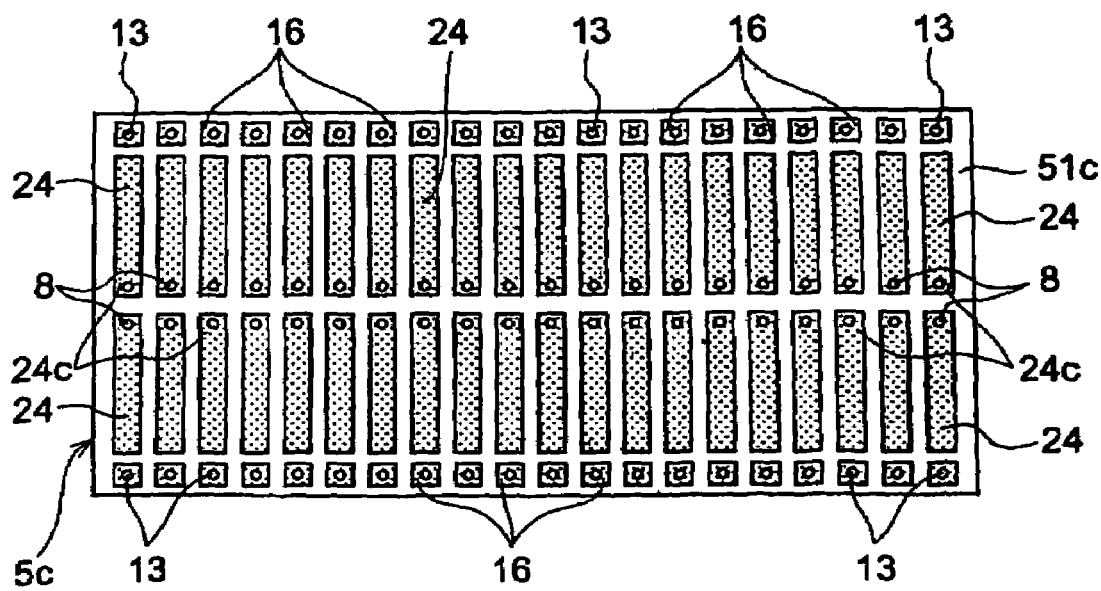
FIG. 12A is a plan view showing the piezoelectric layer as the second, fourth, sixth, and eighth layers of the piezoelectric element shown in FIG. 11.

As shown in FIG. 12A, the individual electrodes 24 are separately arranged in a matrix on the upper surface 51c of the piezoelectric layer 5c to be electrically isolated from each other. The longitudinal inner end 24c of each individual electrode 24 is a contact to be connected to the electric conductor in the through hole 8 formed in the piezoelectric layer 5a directly under the contact 24c.

Figure 12B:
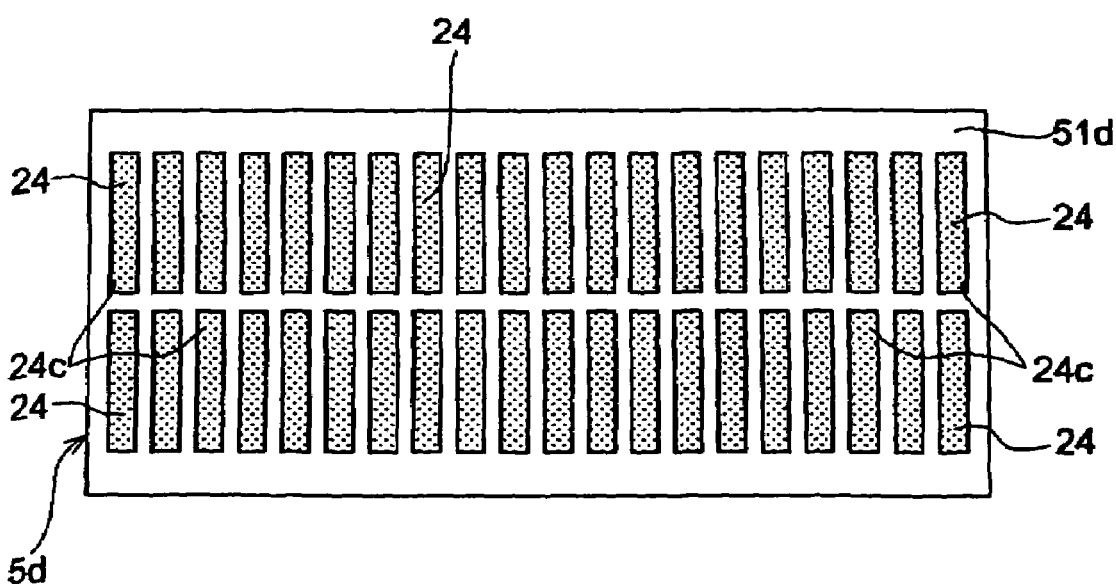
FIG. 12B is a plan view showing the piezoelectric layer as the tenth layer of the piezoelectric element.

The multilayer piezoelectric element 1b includes a piezoelectric layer 5d as its tenth layer. On the upper surface 51d of the piezoelectric layer 5d, the electrode pattern similar to those on the piezoelectric layers 5c is provided. However, as shown in FIG. 12B, the tenth layer 5d differs from the piezoelectric layers 5c in that the intermediate electrodes 16 and through holes 8 and 13 are not formed on the upper surface 51d.

Figure 13A:
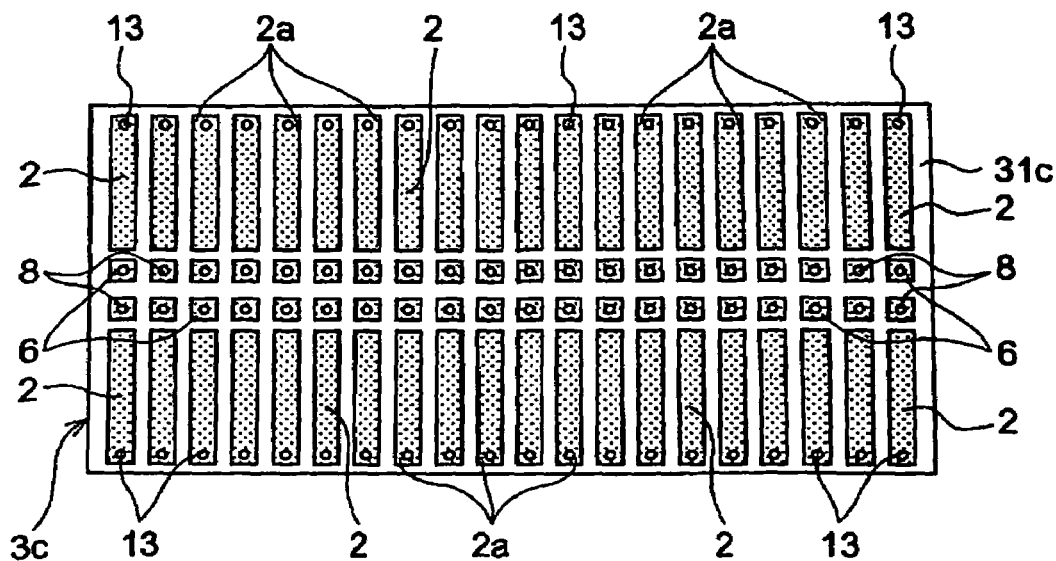
FIG. 13A is a plan view showing the piezoelectric layer as the third, fifth, and seventh layers of the piezoelectric element shown in FIG. 11.

In the piezoelectric layer 3c, as shown in FIG. 13A, the intermediate electrodes 6 are formed at the longitudinal inner side of the individual electrodes 2 so as to oppose their respective contacts 24c on the piezoelectric layer 5c. The intermediate electrodes 6 are connected to the respective conductors in the through holes 8 formed in the piezoelectric layer 3c directly under the electrodes 6.

Figure 13B:
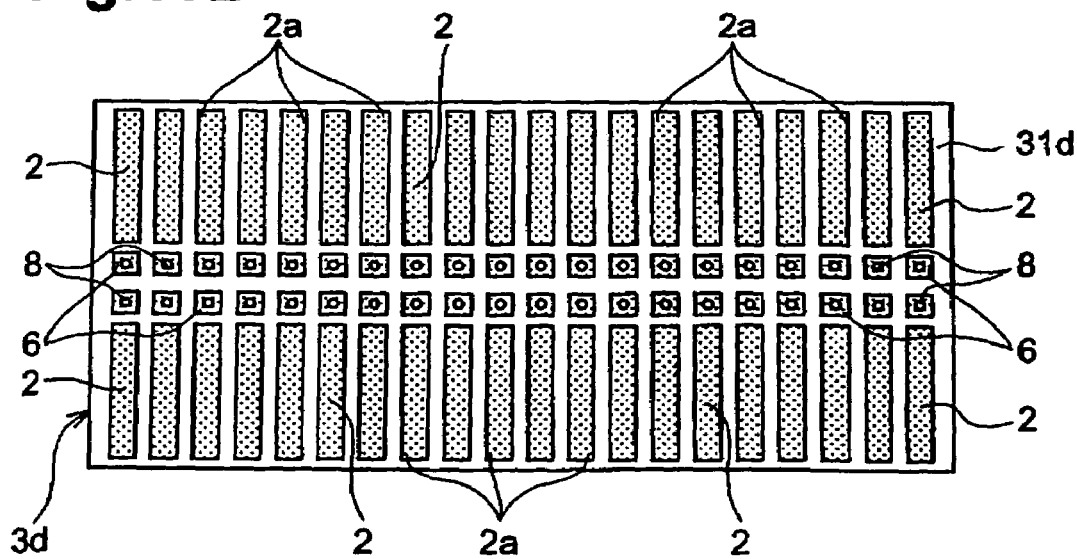
FIG. 13B is a plan view showing the piezoelectric layer as the ninth layer of the piezoelectric element.
Figure 14:
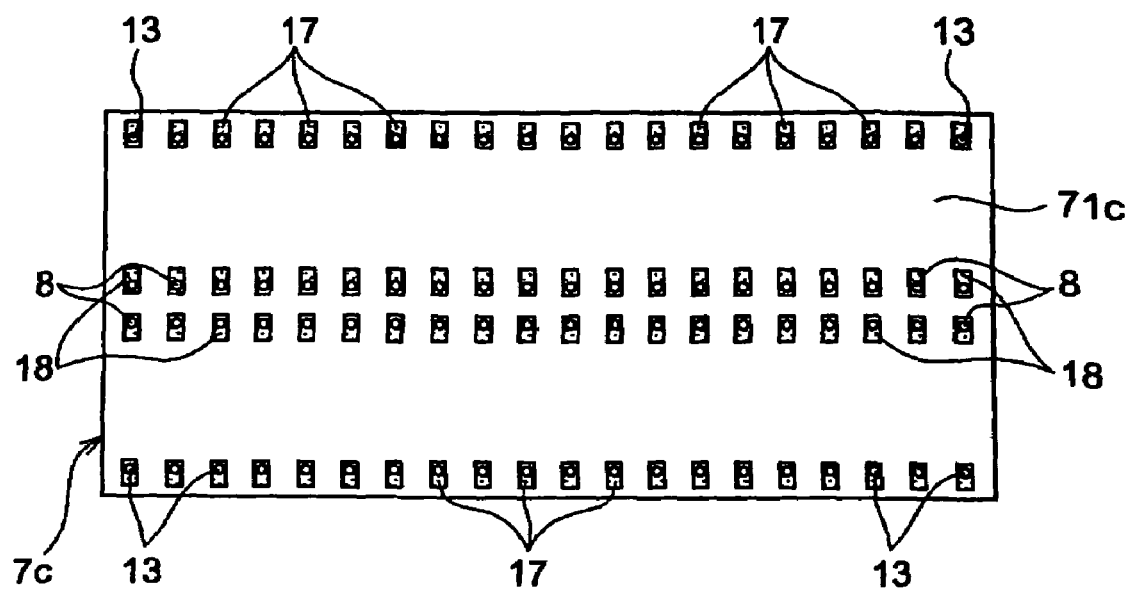
FIG. 14 is a plan view showing the uppermost piezoelectric layer in the third embodiment of the multilayer piezoelectric element in accordance with the present invention.

The multilayer piezoelectric element 1b also includes a piezoelectric layer 3d as its ninth layer. On the upper surface 31d of the piezoelectric layer 3d, the electrode pattern similar to those on the piezoelectric layers 3c is provided. However, as shown in FIG. 13B, the ninth layer 3d differs from the piezoelectric layers 3c in that no through holes 13 are formed on the upper surface 31d.

On the upper surface 71c of the piezoelectric layer 7c, as shown in FIG. 13, the external electrodes 17 are formed so as to oppose their corresponding internal electrodes 16 on the piezoelectric layer 5c, and the external electrodes 18 are formed so as to oppose their corresponding internal electrodes 6 on the piezoelectric layer 3c. The external electrodes 17 are connected to the respective conductors in the through holes 13 formed in the piezoelectric layer 7c directly under the external electrodes 17, and the external electrodes 18 are connected to the respective conductors in the through holes 8 formed in the piezoelectric layer 7c directly under the external electrodes 18.

When the piezoelectric layers 3c, 5c and 7c are laminated together similarly to the layers 3a, 5a and 7c in the second embodiment, four of the individual electrodes 2 are aligned with each external electrode 17 on the uppermost layer 7c in the thickness direction by way of the intermediate electrodes 16, and the aligned electrodes 2, 16 and 17 are electrically connected to each other by the conductors in the through holes 13. The five individual electrodes 24 are aligned with each external electrode 18 on the uppermost layer 7c in the thickness direction by way of the internal electrodes 6, and the aligned electrodes 6, 18 and 24 are electrically connected to each other by the conductors in the through holes 8.

Since the individual electrodes 24 are provided so as to oppose the respective individual electrodes 2 in the above-mentioned electrical connections, it is possible to suppress the unevenness in the response speed of the active portions 21 corresponding to the individual electrodes 2 arranged in a matrix.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer piezoelectric element comprising:
   at least one first piezoelectric layer having an upper surface on which a plurality of first internal electrodes are separately arranged; and
   at least one second piezoelectric layer having an upper surface on which a plurality of second internal electrodes are arranged;
   the first and second piezoelectric layers being laminated alternately so that the first and second internal electrodes overlap in one-to-one correspondence and the first internal electrodes are electrically separated from the second internal electrodes.

2. A multilayer piezoelectric element according to claim 1, wherein the first internal electrodes are disposed in a matrix on each first piezoelectric layer.

3. A multilayer piezoelectric element according to claim 1, wherein the second internal electrodes are electrically connected to each other on each second piezoelectric layer.

4. A multilayer piezoelectric element according to claim 3, wherein each second piezoelectric layer includes an extraction electrode electrically connected to the second internal electrodes on the upper surface thereof,
   the multilayer piezoelectric element further comprising an external electrode electrically connecting the extraction electrodes on the second piezoelectric layers to each other.

5. A multilayer piezoelectric element according to claim 1, wherein the second internal electrodes are separately arranged on the upper surface of each second piezoelectric layer.

6. A multilayer piezoelectric element according to claim 1, further comprising a third piezoelectric layer having an upper surface on which a plurality of first terminal electrodes and a second terminal electrode are provided, the first terminal electrodes being electrically connected to the first internal electrodes on each first piezoelectric layer in one-to-one correspondence, the second terminal electrode being electrically connected to the second internal electrodes on each second piezoelectric layer.

7. A multilayer piezoelectric element according to claim 6, further comprising a plurality of external electrodes each of which electrically connects one of the first terminal electrodes on the third piezoelectric layer to the corresponding one of the first internal electrodes on each first piezoelectric layer.

8. A multilayer piezoelectric element according to claim 6, further comprising an external electrode connecting the second terminal electrode on the third piezoelectric layer to the second internal electrode on each second piezoelectric layer.

9. A multilayer piezoelectric element according to claim 6, wherein the third piezoelectric layer has a plurality of through holes extending from the respective first terminal electrodes, and electrical conductors are disposed in the through holes so as to electrically connect the first terminal electrodes to the respective first internal electrodes.

10. A multilayer piezoelectric element according to claim 9, wherein one of the second piezoelectric layers is interposed between the third piezoelectric layer and one of the first piezoelectric layers, and the interposed second layer has a plurality of through holes in which electrical conductors are disposed so as to electrically connect the electrical conductors in the through holes of the third piezoelectric layer to the respective first internal electrodes.

11. A multilayer piezoelectric element according to claim 6, wherein the third piezoelectric layer has a through hole extending from the second terminal electrode, and an electrical conductor is disposed in the through hole so as to electrically connect the second terminal electrode to the second internal electrode.

12. A multilayer piezoelectric element according to claim 11, wherein one of the first piezoelectric layers is interposed between the two second piezoelectric layers, and the interposed first layer has a through hole in which an electrical conductor is disposed so as to electrically connect the electrical conductors in the through holes of the two second piezoelectric layers to each other.

13. A multilayer piezoelectric element according to claim 1, wherein the upper surfaces of the first and second piezoelectric layers are substantially parallel to each other, and one of the first and second internal electrodes overlapping with each other extends longer than that of the other does in a direction parallel to the upper surfaces.

14. A multilayer piezoelectric element according to claim 1, further comprising an additional piezoelectric layer having an upper surface on which a third internal electrode is provided, the third internal electrode is shaped in a continuous sheet having a perimeter extending along the circumference of the upper surface of the additional piezoelectric layer with a gap therebetween.

15. A multilayer piezoelectric element according to claim 14, wherein the third internal electrode includes an extraction portion, wherein the second internal electrodes are electrically connected to each other on each second piezoelectric layer, and wherein each second piezoelectric layer includes an extraction electrode electrically connected to the second internal electrodes on the upper surface thereof, the multilayer piezoelectric element further comprising an external electrode electrically connecting an extraction electrode on each second piezoelectric layer to the extraction portion of the third internal electrode.

* * * * *